United States Patent
Bazes

(10) Patent No.: US 8,624,646 B1
(45) Date of Patent: Jan. 7, 2014

(54) METHOD AND APPARATUS FOR GENERATING ASYMMETRICALLY DESKEWED COMPLEMENTARY SIGNALS

(75) Inventor: Mel Bazes, Haifa (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 17 days.

(21) Appl. No.: 13/231,553

(22) Filed: Sep. 13, 2011

Related U.S. Application Data

(60) Provisional application No. 61/391,510, filed on Oct. 8, 2010.

(51) Int. Cl.
*H03K 5/12* (2006.01)

(52) U.S. Cl.
USPC ............ 327/170; 327/171; 327/291; 327/295

(58) Field of Classification Search
USPC ......... 327/108, 112, 170, 171, 291, 293, 295, 327/297, 299, 415
See application file for complete search history.

(56) References Cited

U.S. PATENT DOCUMENTS 7,119,602 B2 * 10/2006 Davis ........................... 327/415
7,236,518 B2    6/2007 Bazes

* cited by examiner

*Primary Examiner* — An Luu

(57) ABSTRACT

Aspects of the disclosure provide an integrated circuit. The integrated circuit includes a signal generation circuit. The signal generation circuit is configured to generate a first output signal and a second output signal in response to a reference signal. The first output signal and the second output signal are a pair of complementary signals. The first output signal has first transitions of a first polarity and second transitions of a second polarity. The second output signal has third transitions of the second polarity that are simultaneous to the first transitions in the first output signal and has fourth transitions of the first polarity non-simultaneously corresponding to the second transitions in the first output signal.

19 Claims, 6 Drawing Sheets

METHOD AND APPARATUS FOR GENERATING ASYMMETRICALLY DESKEWED COMPLEMENTARY SIGNALS

INCORPORATION BY REFERENCE

This application claims the benefit of U.S. Provisional Application No. 61/391,510 "Complementary Buffer with Asymmetrical Output Deskewing" filed on Oct. 8, 2010, which is incorporated herein by reference in its entirety.

BACKGROUND

The background description provided herein is for the purpose of generally presenting the context of the disclosure. Work of the presently named inventor, to the extent the work is described in this background section, as well as aspects of the description that may not otherwise qualify as prior art at the time of filing, are neither expressly nor impliedly admitted as prior art against the present disclosure.

Occasionally, a circuit requires using a pair of complementary signals. In a high-speed circuit example, the performance of the high-speed circuit can be optimized when a pair of complementary signals is mutually deskewed, i.e., the delay between the corresponding transitions of the complementary signals is substantially equal to zero.

SUMMARY

Aspects of the disclosure provide an integrated circuit. The integrated circuit includes a signal generation circuit. The signal generation circuit is configured to generate a first output signal and a second output signal in response to a reference signal. The first output signal and the second output signal are a pair of complementary signals. The first output signal has first transitions of a first polarity and second transitions of a second polarity. The second output signal has third transitions of the second polarity that are simultaneous to the first transitions in the first output signal and has fourth transitions of the first polarity non-simultaneously corresponding to the second transitions in the first output signal.

For example, the signal generation circuit is configured to generate the second output signal in which the fourth transitions are delayed from the second transitions in the first output signal. In another example, the signal generation circuit is configured to generate the first output signal in which the second transitions are delayed from the fourth transitions in the second output signal.

According to an aspect of the disclosure, the integrated circuit includes an inverting circuit configured to generate a complementary reference signal with respect to the reference signal. The signal generation circuit is configured to generate the first output signal and the second output signal based on the reference signal and the complementary reference signal.

In an embodiment, the signal generation circuit includes a first N-type transistor having a gate terminal configured to receive the reference signal and a source terminal coupled to a first supply potential, and a first P-type transistor having a gate terminal configured to receive the reference signal and a source terminal coupled to a second supply potential. Further, the signal generation circuit includes a second N-type transistor having a gate terminal configured to receive the complementary reference signal and a source terminal coupled to the first supply potential, and a second P-type transistor having a gate terminal configured to receive the complementary reference signal and a source terminal coupled to the second supply potential.

In addition, in an example, the signal generation circuit further includes a third N-type transistor having a source terminal coupled to a drain terminal of the first N-type transistor, a gate terminal coupled to a drain terminal of the second P-type transistor, and a drain terminal coupled to a drain terminal of the first P-type transistor to output the first output signal, and a third P-type transistor having a gate terminal coupled to the drain terminal of the first N-type transistor and the source terminal of the third. N-type transistor, a source terminal coupled to the drain terminal of the second P-type transistor and the gate terminal of the third N-type transistor, and a drain terminal coupled to a drain terminal of the second N-type transistor to output the second output signal.

In another example, the signal generation circuit includes a third N-type transistor having a gate terminal coupled to the drain terminal of the first P-type transistor, a source terminal coupled to the drain terminal of the second N-type transistor and a drain terminal coupled to the drain terminal of the second P-type transistor to output the second output signal, and a third P-type transistor having a gate terminal coupled to the drain terminal of the second N-type transistor and to the source terminal of the third N-type transistor, a source terminal coupled to the gate terminal of the third N-type transistor and to the drain terminal of the first P-type transistor, and a drain terminal coupled to the drain terminal of the first N-type transistor to output the first output signal.

Aspects of the disclosure provide a method for generating a pair of complementary signals. The method includes receiving a reference signal, generating a first output signal in response to the reference signal, and generating a second output signal in response to the reference signal. The first output signal and the second output signal are a pair of complementary signals. The first output signal has first transitions of a first polarity and second transitions of a second polarity. The second output signal has third transitions of the second polarity that are simultaneous to the first transitions in the first output signal and has fourth transitions of the first polarity non-simultaneously corresponding to the second transitions in the first output signal.

Aspects of the disclosure provide a system. The system includes a complementary signal generation circuit, and a functional circuit. The complementary signal generation circuit is configured to generate a first output signal and a second output signal in response to a reference signal. The first output signal and the second output signal are a pair of complementary signals. The first output signal has first transitions of a first polarity and second transitions of a second polarity. The second output signal has third transitions of the second polarity that are simultaneous to the first transitions in the first output signal and has fourth transitions of the first polarity non-simultaneously corresponding to the second transitions in the first output signal. The functional circuit includes a first portion configured to be operative in response to the first transitions in the first output signal, and a second portion configured to be operative in response to the third transitions in the second output signal.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
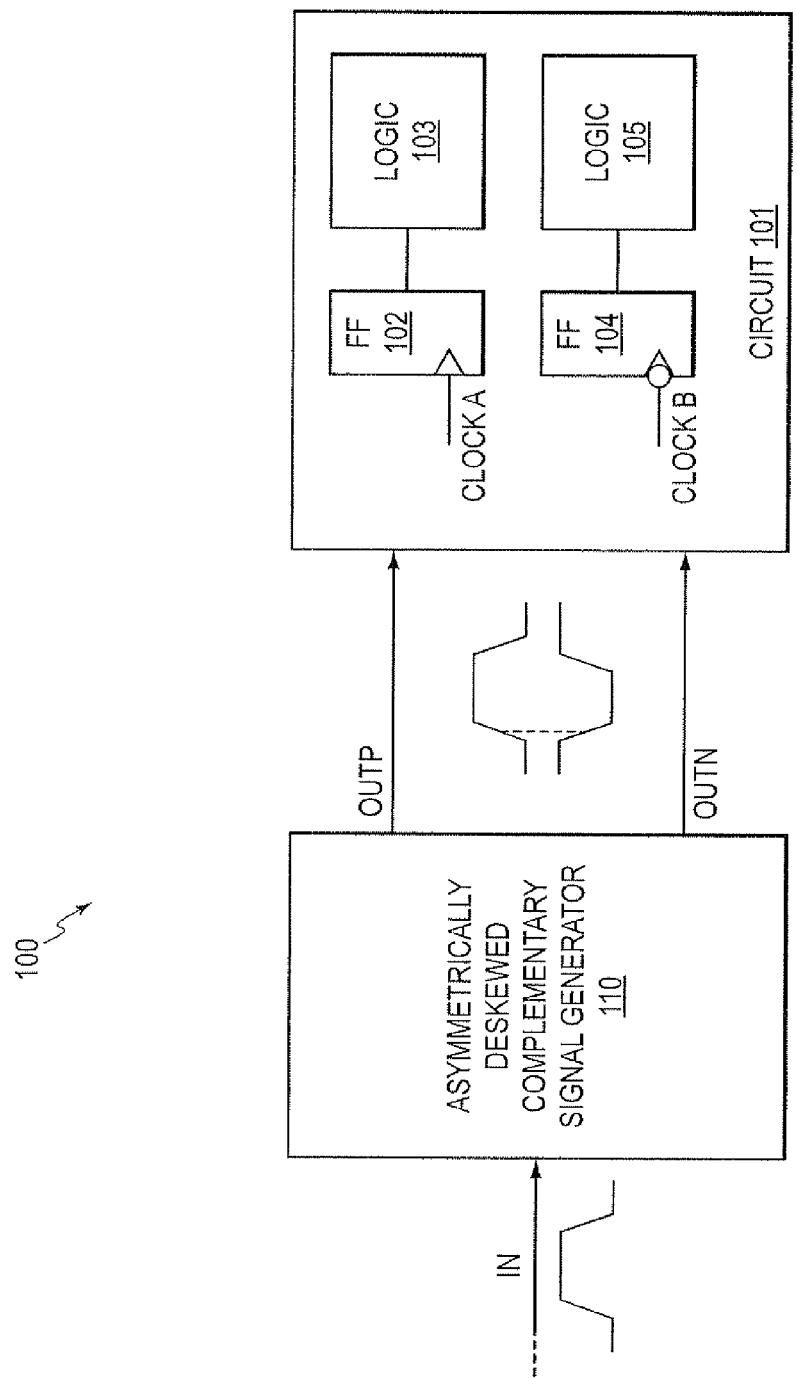
FIG. 1 shows a block diagram of an electronic system example 100 according to an embodiment of the disclosure.

FIG. 1 shows a block diagram of an electronic system example 100 according to an embodiment of the disclosure. The electronic system 100 includes a circuit 101 and an asymmetrically deskewed complementary signal generator 110. These elements are coupled together as shown in FIG. 1.

The asymmetrically deskewed complementary signal generator 110 receives an input signal IN and outputs a pair of asymmetrically deskewed complementary signals in response to the input signal IN. The pair of asymmetrically deskewed complementary signals includes a positive signal OUTP and a negative signal OUTN. Specifically, the positive signal OUTP has rising edge transitions in response to rising edge transitions of the input signal IN, and has falling edge transitions in response to falling edge transitions of the input signal IN; while the negative signal OUTN has falling edge transitions in response to the rising edge transitions of the input signal IN, and has rising edge transitions in response to the falling edge transitions of the input signal IN. Thus, the rising edge transitions of the positive signal OUTP correspond to the falling edge transitions of the negative signal OUTN, and the falling edge transitions of the positive signal OUTP correspond to the rising edge transitions of the negative signal OUTN.

In addition, the positive signal OUTP and the negative signal OUTN are asymmetrically deskewed complementary signals. In an example, the rising edge transitions of the positive signal OUTP and the corresponding falling edge transitions of the negative signal OUTN are deskewed. In other words, the delay between the rising edge transitions of the positive signal OUTP and the corresponding falling edge transitions of the negative signal OUTN is substantially equal to zero. But the falling edge transitions of the positive signal OUTP and the corresponding rising edge transitions of the negative signal OUTN are skewed. For example, the falling edge transitions of the positive signal OUTP are later than the corresponding rising edge transitions of the negative signal OUTN.

In another example, the falling edge transitions of the positive signal OUTP and the corresponding rising edge transitions of the negative signal OUTN are deskewed. In other words, the delay between the falling edge transitions of the positive signal OUTP and the corresponding rising edge transitions of the negative signal OUTN is substantially equal to zero. But the rising edge transitions of the positive signal OUTP and the corresponding falling edge transitions of the negative signal OUTN are skewed. For example, the rising edge transitions of the positive signal OUTP are later than the corresponding falling edge transitions of the negative signal OUTN.

According to an aspect of the disclosure, the circuit 101 is configured to operate in response to the deskewed edges of the positive signal OUTP and the negative signal OUTN. In an example, the circuit 101 is configured to operate based on a pair of complementary clock signals. In an example, the circuit 101 includes a first portion that includes a first flip-flop (FF) 102 and a first logic circuit 103, and a second portion that includes a second flip-flop (FF) 104 and a second logic circuit 105. The first flip-flop 102 is configured to operate in response to rising edge transitions of a first clock signal CLOCK_A. The second flip-flop 104 is configured to operate in response to falling edge transitions of a second clock signal CLOCK_B. The second clock signal CLOCK_B is a complementary clock signal of the first clock signal CLOCK_A. In an embodiment, the circuit 101 has optimum performance when the rising edge transitions of the first clock signal CLOCK_A and the falling edge transitions of the second clock signal CLOCK_B are deskewed.

In an example, the input signal IN is a clock signal. The asymmetrically deskewed complementary signal generator 110 generates a pair of asymmetrically deskewed complementary clock signals based on the input clock signal IN. The pair of asymmetrically deskewed complementary clock signals includes the positive clock signal OUTP and the negative clock signal OUTN. The positive clock signal OUTP is provided to the circuit 101 as the first clock signal CLOCK_A and the negative clock signal OUTN is provided to the circuit 101 as the second clock signal CLOCK_B. Because the rising edge transitions of the positive clock signal OUTP and the corresponding falling edge transitions of the negative clock signal OUTN are deskewed, the circuit 101 has optimum performance.

Figure 2:
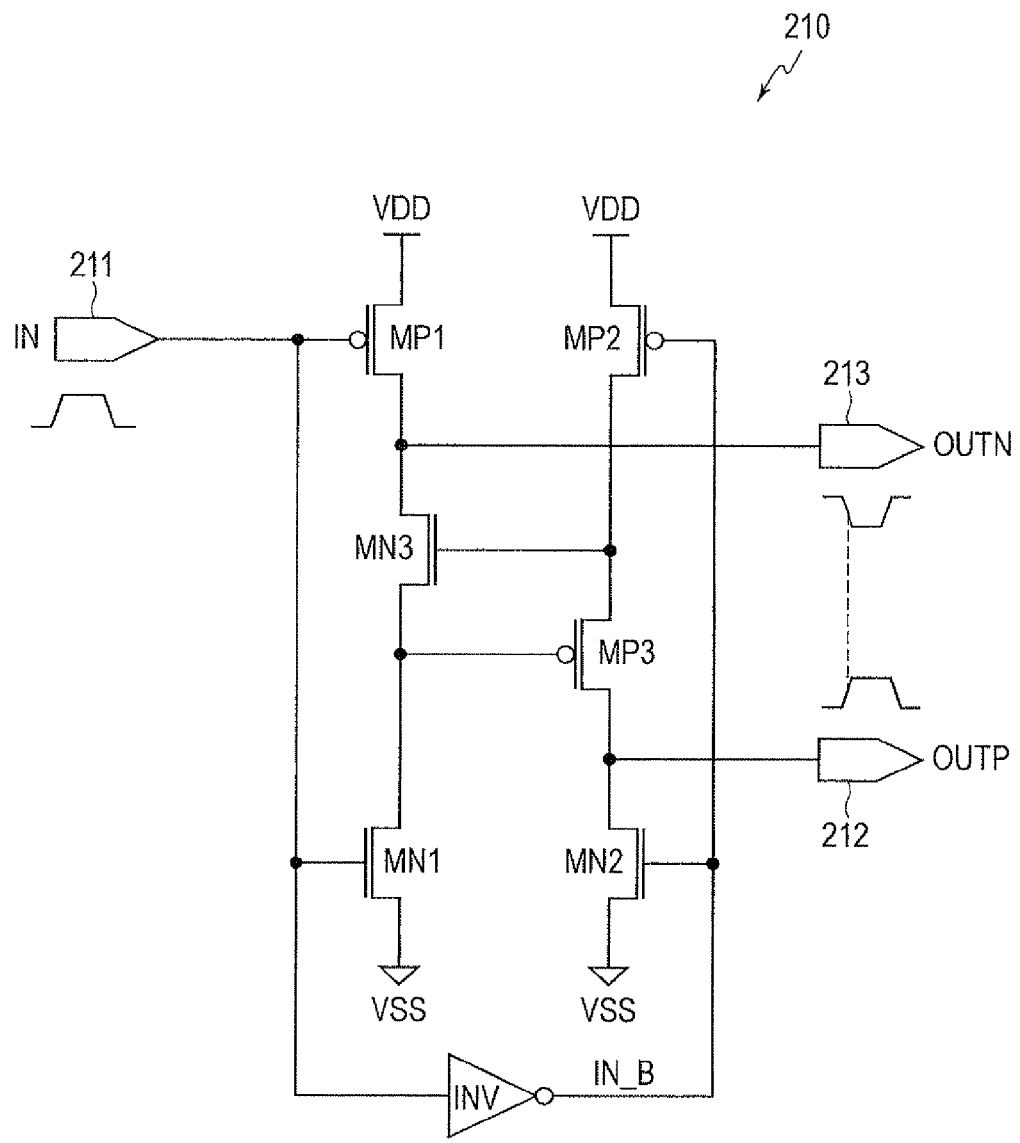
FIG. 2 shows a circuit diagram of an asymmetrically deskewed complementary signal generator example 210 according to an embodiment of the disclosure.

FIG. 2 shows a circuit diagram of an asymmetrical deskewed complementary signal generator example 210 according to an embodiment of the disclosure. The asymmetrically deskewed complementary signal generator 210 receives an input signal IN and outputs a pair of asymmetrically deskewed complementary signals including a positive signal OUTP and a negative signal OUTN. The rising edge transitions of the positive signal QUIP and the corresponding falling edge transitions of the negative signal OUTN are deskewed. In other words, the delay between the rising edge transitions of the positive signal OUTP and the corresponding falling edge transitions of the negative signal OUTN is substantially equal to zero.

In FIG. 2 example, the asymmetrically deskewed complementary signal generator 210 is implemented using complementary metal-oxide-semiconductor (CMOS) technology. The asymmetrically deskewed complementary signal generator 210 includes N-type MOS transistors MN1, MN2 and MN3, P-type MOS transistors MP1, MP2 and MP3, and an inverter INV. These elements are coupled together as shown in FIG. 2.

Specifically, the asymmetrically deskewed complementary signal generator 210 has an input node 211, a first output node 212 and a second output node 213. The input node 211 receives the input signal IN. Further, the input node 211 is coupled to the gate terminal of the P-type MOS transistor MP1, the gate terminal of the N-type MOS transistor MN1, and the input of the inverter INV. The output of the inverter INV is coupled to the gate terminal of the P-type MOS transistor MP2 and the gate terminal of the N-type MOS transistor MN2.

In an example, the circuit 210 includes a first power supply rail of a high voltage VDD (e.g., positive voltage) and a second power supply rail of a low voltage VSS (e.g., ground) to provide power supply to the circuit components. The first power supply rail of VDD is coupled to the source terminal of the P-type MOS transistor MP1 and the source terminal of the P-type MOS transistor MP2. The second power supply rail of VSS is coupled to the source terminal of the N-type transistor MN1 and the source terminal of N-type transistor MN2. The drain terminal of the P-type transistor MP1 is coupled to the drain terminal of the N-type transistor MN3. It is noted that the drain terminal of the P-type transistor MP1 is also coupled to the second output node 213. The source terminal of the N-type transistor MN3 is coupled to both the gate terminal of the P-type transistor MP3 and the drain terminal of the N-type transistor MN1. The drain terminal of the N-type transistor MN2 is coupled to the drain terminal of the P-type transistor MP3. It is noted that the drain terminal of the N-type transistor MN2 is also coupled to the first output node 212. The source terminal of the P-type transistor MP3 is coupled to the gate terminal of the N-type transistor MN3 and the drain terminal of the P-type transistor MP2.

The asymmetrically deskewed complementary signal generator 210 generates the positive signal OUTP at the first output node 212 and generates the negative signal OUTN at the second output node 213. The positive signal OUTP has rising edge transitions in response to rising edge transitions of the input signal IN, and has falling edge transitions in response to falling edge transitions of the input signal IN; while the negative signal OUTN has falling edge transitions in response to the rising edge transitions of the input signal IN, and has rising edge transitions in response to the falling edge transitions of the input signal IN. Thus, the rising edge transitions of the positive signal OUTP correspond to the falling edge transitions of the negative signal OUTN, and the falling edge transitions of the positive signal OUTP correspond to the rising edge transitions of the negative signal OUTN.

In addition, the rising edge transitions of the positive signal OUTP and the falling edge transitions of the negative signal OUTN are deskewed. In other words, the delay between the rising edge transitions of the positive signal OUTP and the corresponding falling edge transitions of the negative signal OUTN is substantially equal to zero.

Specifically, when the input signal IN is at low voltage level, the output of the inverter INV is at high voltage level. The P-type MOS transistor MP1 is turned on due to low voltage level of the input signal IN and the N-type MOS transistor MN2 is turned on due to high voltage level of the output of the inverter INV. The other transistors MN1, MN3, MP2 and MP3 are all turned off. Because the P-type MOS transistor MP1 is turned on, the negative signal OUTN is at high voltage level. Because the N-type MOS transistor MN2 is turned on, the positive signal OUTP is at low voltage level.

When the input signal IN switches from low voltage level to high voltage level (a rising edge transition), the output of the inverter INV switches from high voltage level to low voltage level (a falling edge transition) after a time duration due to the delay of the inverter INV. According to an aspect of the disclosure, the time duration is short, however, non-negligible. Within this short time duration, the P-type MOS transistor MP1 turns off and the N-type MOS transistor MN1 is turned on due to the high voltage level of the input signal IN. The N-type MOS transistor MN1 pulls down the voltage at the source terminal of the N-type MOS transistor MN3 and the gate terminal of the P-type MOS transistor MP3 to VSS.

After the short time duration, the output of the inverter INV switches from high voltage level to low voltage level. Then, the P-type MOS transistor MP2 turns on, and the N-type MOS transistor MN2 turns off due to the low voltage level of the output of the inverter INV. When the P-type MOS transistor MP2 turns on, the N-type MOS transistor MN3 and the P-type MOS transistor MP3 are turned on. Because the source terminal of the N-type MOS transistor MN3 and the gate terminal of the P-type MOS transistor MP3 are previously pulled down to VSS by the N-type MOS transistor MN1, the N-type MOS transistor MN3 and the P-type MOS transistor MP3 are turned on at substantially the same time. The N-type MOS transistors MN3 and MN1 pull down the voltage of the negative signal OUTN, and the P-type MOS transistors MP2 and MP3 pull up the voltage of the positive signal OUTP. Thus, the positive signal OUTP has a rising edge transition and the negative signal OUTN has a falling edge transition substantially at the same time. In other words, the rising edge transition of the positive signal OUTP and the falling edge transition of the negative signal OUTN are deskewed.

When the input signal IN switches from high voltage level to low voltage level (a falling edge transition), the P-type MOS transistor MP1 turns on first. After a time duration corresponding to the delay of the inverter INV, the output of the inverter switches from low voltage level to high voltage level, and then the N-type MOS transistor MN2 turns on next. When the P-type MOS transistor MP1 is turned on, the negative signal OUTN is pulled to high voltage level and thus has a rising edge transition. After the N-type MOS transistor MN2 is turned on, the positive signal OUTP is pulled to low voltage level and thus has a falling edge transition. Thus, the falling edge transition of the positive signal OUTP is delayed with regard to the rising edge transition of the negative signal OUTN by the time duration corresponding to the delay of the inverter INV.

Figure 3:
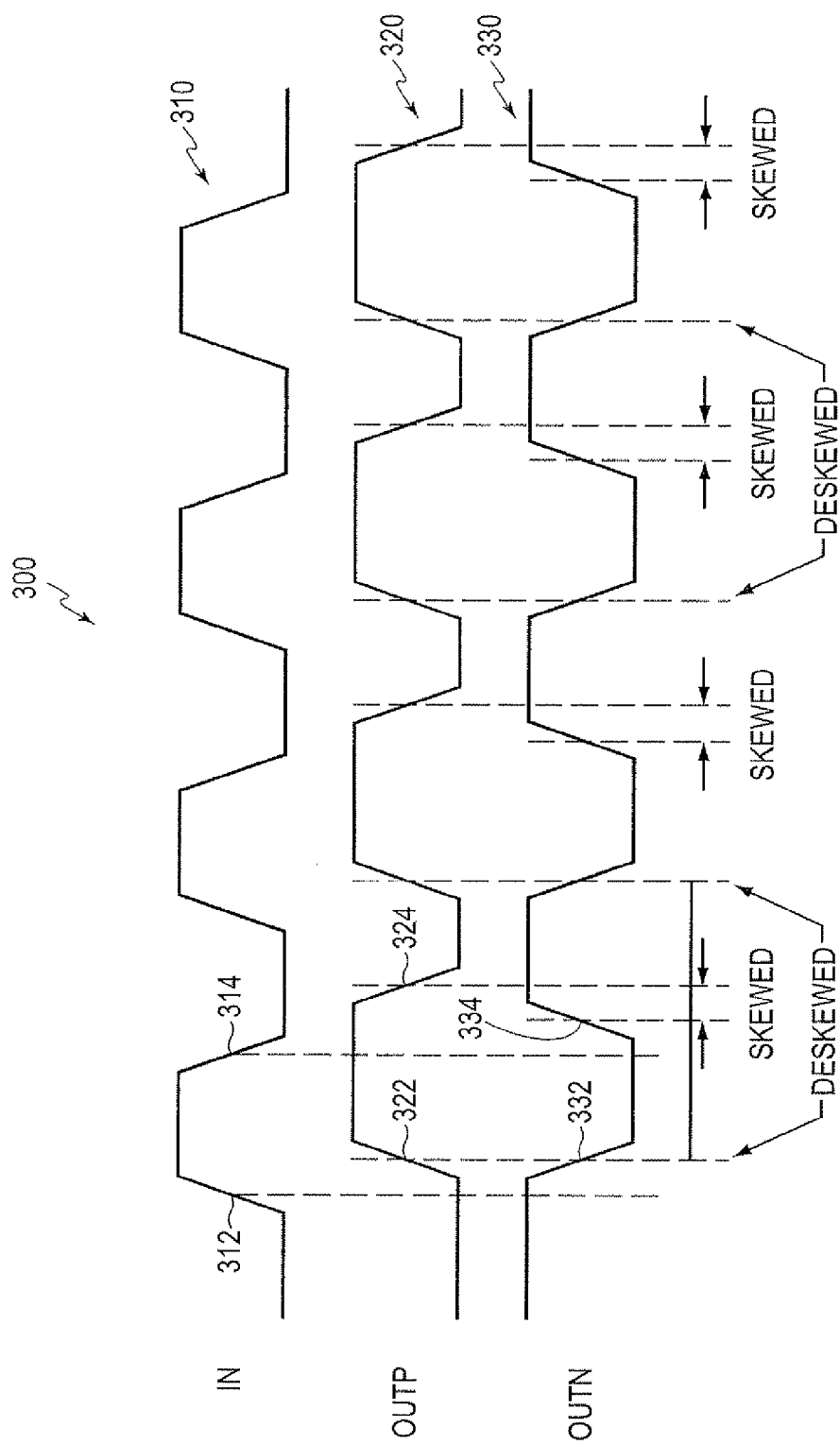
FIG. 3 shows a plot of signal waveforms for the asymmetrically deskewed complementary signal generator 210 according to an embodiment of the disclosure.

FIG. 3 shows a plot of waveform example for the asymmetrically deskewed complementary signal generator 210 according to an embodiment of the disclosure. The plot 300 includes a first waveform 310 for the input signal IN, a second waveform 320 for the positive signal OUTP and a third waveform 330 for the negative signal OUTN. The positive signal OUTP has rising edge transitions 322 in response to rising edge transitions 312 of the input signal IN, and has falling edge transitions 324 in response to falling edge transitions 314 of the input signal IN. The negative signal OUTN has falling edge transitions 332 in response to the rising edge transitions 312 of the input signal IN, and has rising edge transitions 334 in response to the falling edge transitions 314 of the input signal IN. The rising edge transitions 322 of the positive signal OUTP and the falling edge transitions 332 of the negative signal OUTN are deskewed because they have substantially equal delay to the rising edge transitions 312 of the input signal IN. The falling edge transitions 324 of the positive signal OUTP and the rising edge transitions 334 of the negative signal OUTN are skewed because their delay to the falling edge transitions 314 of the input signal IN are not equal. Specifically, in this embodiment, the falling edge transitions 324 of the positive signal OUTP have longer delay than the rising edge transitions of the negative signal OUTN in response to the falling edge transitions of the input signal IN.

Figure 4:
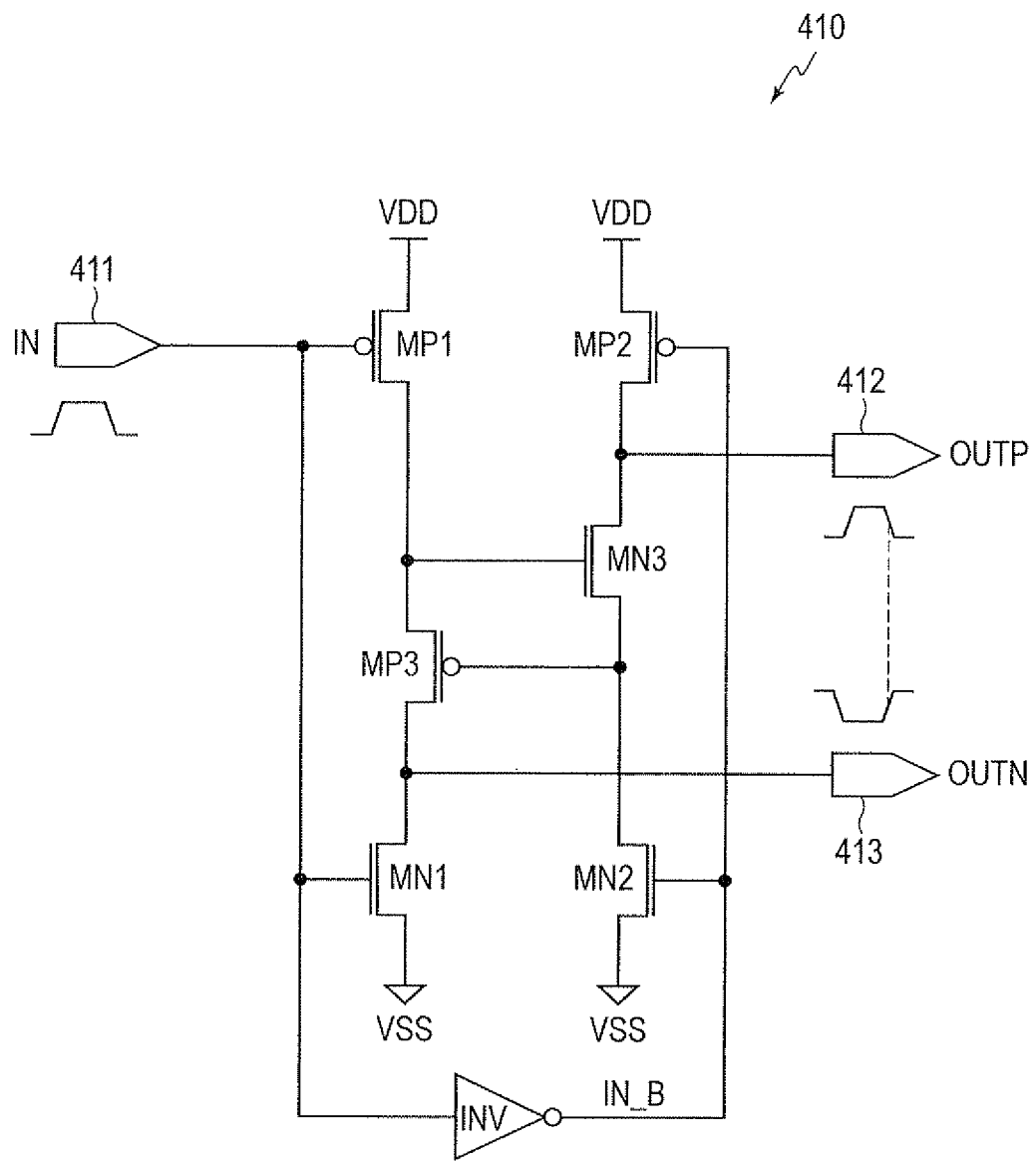
FIG. 4 shows a circuit diagram of another asymmetrically deskewed complementary signal generator example 410 according to an embodiment of the disclosure.

FIG. 4 shows a circuit diagram of an asymmetrical deskewed complementary signal generator example 410 according to an alternative embodiment of the disclosure. The asymmetrically deskewed complementary signal generator 410 receives an input signal IN and outputs a pair of asymmetrically deskewed complementary signals including a positive signal OUTP and a negative signal OUTN. The falling edge transitions of the positive signal OUTP and the corresponding rising edge transitions of the negative signal OUTN are deskewed. In other words, the delay between the falling edge transitions of the positive signal OUTP and the corresponding rising edge transitions of the negative signal OUTN is substantially equal to zero.

In the FIG. 4 example, the asymmetrically deskewed complementary signal generator 410 is implemented using complementary metal-oxide-semiconductor (CMOS) technology. The asymmetrically deskewed complementary signal generator 410 includes N-type MOS transistors MN1, MN2 and MN3, P-type MOS transistors MP1, MP2 and MP3, and an inverter INV. These elements are coupled together as shown in FIG. 4.

Specifically, the asymmetrically deskewed complementary signal generator 410 has an input node 411, a first output node 412 and a second output node 413. The input node 411 receives the input signal IN. Further, the input node 411 is coupled to the gate terminal of the P-type MOS transistor MP1, the gate terminal of the N-type MOS transistor MN1, and the input of the inverter INV. The output of the inverter INV is coupled to the gate terminal of the P-type MOS transistor MP2 and the gate terminal of the N-type MOS transistor MN2.

In an example, the circuit 410 includes a first power supply rail of a high voltage VDD (e.g., positive voltage) and a second power supply rail of a low voltage VSS (e.g., ground) to provide power supply to the circuit components. The first power supply rail of VDD is coupled to the source terminal of the P-type MOS transistor MP1 and the source terminal of the P-type MOS transistor MP2. The second power supply rail of VSS is coupled to the source terminal of the N-type MOS transistor MN1 and the source terminal of N-type MOS transistor MN2. The drain terminal of the P-type MOS transistor MP2 is coupled to the drain terminal of the N-type MOS transistor MN3. It is noted that the drain terminal of the P-type MOS transistor MP2 is also coupled to the first output node 412. The source terminal of the N-type MOS transistor MN3 is coupled to both the gate terminal of the P-type MOS transistor MP3 and the drain terminal of the N-type MOS transistor MN2. The drain terminal of the N-type MOS transistor MN1 is coupled to the drain terminal of the P-type MOS transistor MP3. It is noted that the drain terminal of the N-type MOS transistor MN1 is also coupled to the second output node 413. The source terminal of the P-type MOS transistor MP3 is coupled to the gate terminal of the N-type MOS transistor MN3 and the drain terminal of the P-type MOS transistor MP1.

The asymmetrically deskewed complementary signal generator 410 generates the positive signal OUTP at the first output node 412 and generates the negative signal OUTN at the second output node 413. The positive signal OUTP has rising edge transitions in response to rising edge transitions of the input signal IN, and has falling edge transitions in response to falling edge transitions of the input signal IN; while the negative signal OUTN has falling edge transitions in response to the rising edge transitions of the input signal IN, and has rising edge transitions in response to the falling edge transitions of the input signal IN. Thus, the rising edge transitions of the positive signal OUTP correspond to the falling edge transitions of the negative signal OUTN, and the falling edge transitions of the positive signal OUTP correspond to the rising edge transitions of the negative signal OUTN.

In addition, the falling edge transitions of the positive signal OUTP and the rising edge transitions of the negative signal OUTN are deskewed. In other words, the delay between the falling edge transitions of the positive signal OUTP and the rising edge transitions of the negative signal OUTN is substantially equal to zero.

Specifically, when the input signal IN is at low voltage level, the output of the inverter INV is at high voltage level. The P-type MOS transistor MP1 is turned on due to low voltage level of the input signal IN. The P-type MOS transistor MN pulls up the voltage at the gate terminal of the N-type MOS transistor MN3, and thus the N-type MOS transistor MN3 is also turned on. The N-type MOS transistor MN2 is turned on due to high voltage level of the output of the inverter INV. The N-type MOS transistor MN2 pulls down the voltage at the gate terminal of the P-type MOS transistor MP3, and thus the P-type MOS transistor MP3 is turned on. Because both P-type MOS transistors MP1 and MP3 are turned on, the negative signal OUTN is at high voltage level. Because both N-type MOS transistors MN2 and MN3 are turned on, the positive signal OUTP is at low voltage level.

When the input signal IN switches from low voltage level to high voltage level (a rising edge transition), the N-type MOS transistor MN1 turns on first. After a time duration corresponding to the delay of the inverter INV, the output of the inverter INV switches from high voltage level to low voltage level, and then the P-type MOS transistor MP2 turns on next. When the N-type MOS transistor MN1 is turned on, the negative signal OUTN is pulled to low voltage level and thus has a falling edge transition. After the P-type MOS transistor MP2 is turned on, the positive signal OUTP is pulled to high voltage level and thus has a rising edge transition. Thus, the rising edge transition of the positive signal OUTP is delayed with regard to the falling edge transition of the negative signal OUTN by the time duration corresponding to the delay of the inverter INV.

It is noted that when the input signal IN is at the high voltage level, the P-type MOS transistors MP1 and MP3 are turned off, and the N-type MOS transistors MN2 and MN3 are also turned off.

When the input signal IN switches from high voltage level to low voltage level (a falling edge transition), the output of the inverter INV switches from low voltage level to high voltage level (a rising edge transition) after a time duration due to the delay of the inverter INV. According to an aspect of the disclosure, the time duration is short, however, non-negligible. Within this short time duration, the P-type MOS transistor MP1 is turned on and the N-type MOS transistor MN1 is turned off due to the low voltage level of the input signal IN. The P-type MOS transistor MP1 pulls up the voltage at the source terminal of the P-type MOS transistor MP3 and the gate terminal of the N-type MOS transistor MN3 to VDD.

After the short time duration, the output of the inverter INV switches from low voltage level to high voltage level. Then, the P-type MOS transistor MP2 is turned off, and the N-type MOS transistor MN2 is turned on due to the high voltage level of the output of the inverter INV. When the N-type MOS transistor MN2 is turned on, the N-type MOS transistor MN2 pulls down the voltage at the drain terminal of the N-type MOS transistor MN3 and the gate terminal of the P-type MOS transistor MP3. Because the voltage at the source terminal of the P-type MOS transistor MP3 and the gate terminal of the N-type MOS transistor MN3 was previously pulled up to VDD by the P-type MOS transistor MP1, the N-type MOS transistor MN3 and the P-type MOS transistor MP3 are turned on at substantially the same time. The N-type MOS transistors MN3 and MN2 pull down the voltage of the positive signal OUTP, and the P-type MOS transistors MP1 and MP3 pull up the voltage of the negative signal OUTN. Thus, the positive signal OUTP has a falling edge transition and the negative signal OUTN has a rising edge transition substantially at the same time. In other words, the falling edge transition of the positive signal OUTP and the rising edge transition of the negative signal OUTN are deskewed.

Figure 5:
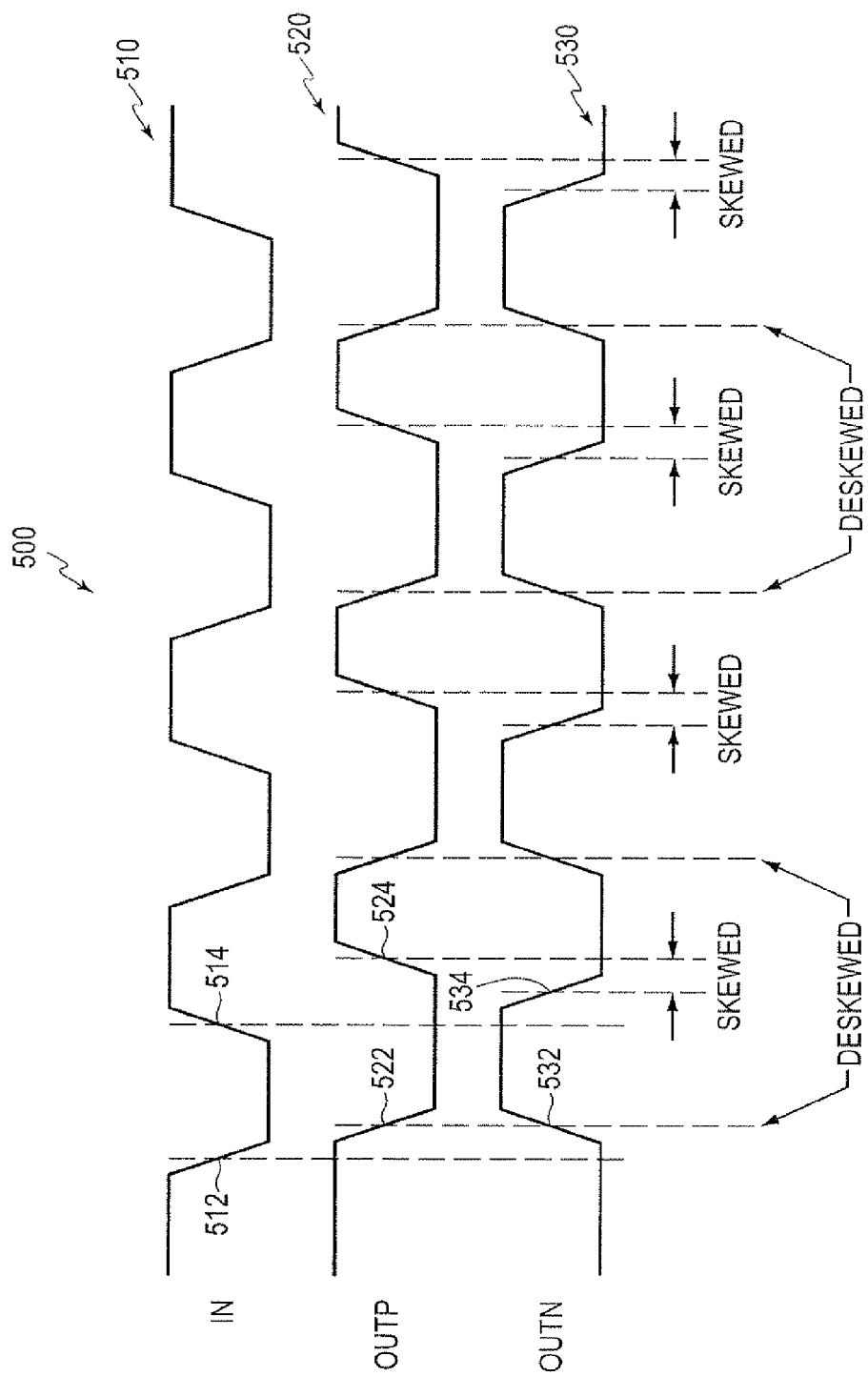
FIG. 5 shows a plot of signal waveforms for the asymmetrically deskewed complementary signal generator 410 according to an embodiment of the disclosure.

FIG. 5 shows a plot of waveform example for the asymmetrically deskewed complementary signal generator 410 according to an embodiment of the disclosure. The plot 500 includes a first waveform 510 for the input signal IN, a second waveform 520 for the positive signal OUTP and a third waveform 530 for the negative signal OUTN. The positive signal OUTP has falling edge transitions 522 in response to falling edge transitions 512 of the input signal IN, and has rising edge transitions 524 in response to rising edge transitions 514 of the input signal IN. The negative signal OUTN has rising edge transitions 532 in response to the falling edge transitions 512 of the input signal IN, and has falling edge transitions 534 in response to the rising edge transitions 514 of the input signal IN. The falling edge transitions 522 of the positive signal OUTP and the rising edge transitions 532 of the negative signal OUTN are deskewed in that they have substantially equal delay to the falling edge transitions 512 of the input signal IN. The rising edge transitions 524 of the positive signal OUTP and the falling edge transitions 534 of the negative signal OUTN are skewed. Specifically, in this embodiment, the rising edge transitions 524 of the positive signal OUTP have longer delay than the falling edge transitions 534 of the negative signal OUTN in response to the rising edge transitions 514 of the input signal IN.

Figure 6:
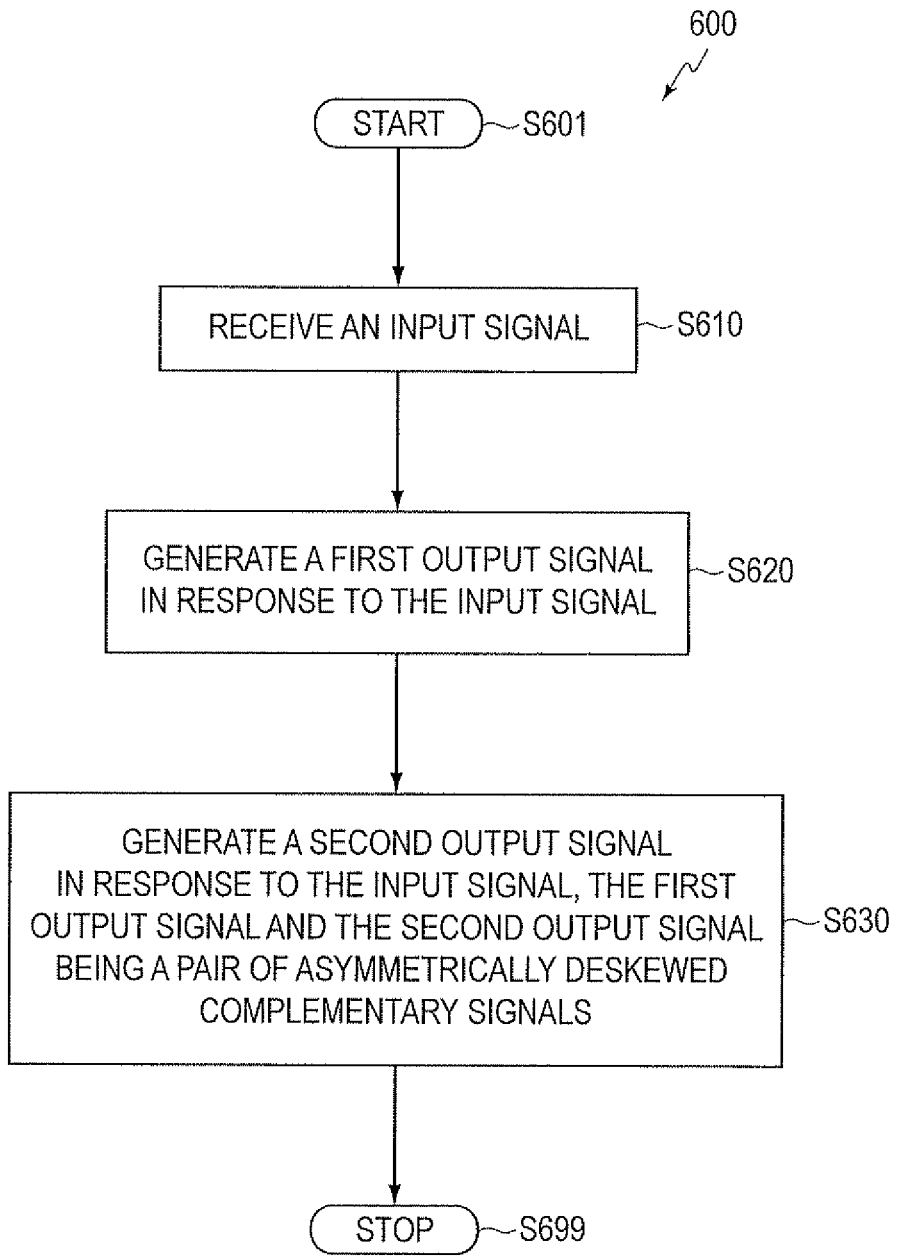
FIG. 6 shows a flow chart outlining operations of an asymmetrically deskewed complementary signal generator according to an embodiment of the disclosure.

FIG. 6 shows a flow chart outlining functional operation of an asymmetrically deskewed complementary signal generator according to an embodiment of the disclosure. The operation starts at S601 and proceeds to S610.

At S610, the asymmetrically deskewed complementary signal generator receives an input signal.

At S620, the asymmetrically deskewed complementary signal generator generates a first output signal in response to the input signal. In an example, the asymmetrically deskewed complementary signal generator generates a rising edge transition in the first output signal in response to a rising edge transition in the input signal with a first delay and generates a falling edge transition in the first output signal in response to a falling edge transition in the input signal with a second delay.

At S630, the asymmetrically deskewed complementary signal generator generates a second output signal in response to the input signal. The first output signal and the second output signal are a pair of complementary signals that are asymmetrically deskewed. In an example, the asymmetrically deskewed complementary signal generator generates a falling edge transition in the second output signal in response to a rising edge transition in the input signal with the first delay and generates a rising edge transition in the second output signal in response to a falling edge transition in the input signal with a delay that is different from the second delay. Thus, the rising edge transitions in the first output signal and the falling edge transitions in the second output signal are deskewed, and the falling edge transitions in the first output signal and the rising edge transitions in the second output signal are skewed.

In another example, the asymmetrically deskewed complementary signal generator generates a falling edge transition in the second output signal in response to a rising edge transition in the input signal with a delay that is different from the first delay and generates a rising edge transition in the second output signal in response to a falling edge transition in the input signal with the second delay. Thus, the falling edge transitions in the first output signal and the rising edge transitions in the second output signal are deskewed, and the rising edge transitions in the first output signal and the falling edge transitions in the second output signal are skewed. Then, the operation proceeds to S699 and terminates.

While the invention has been described in conjunction with the specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the scope of the invention.

What is claimed is:

1. An integrated circuit consisting of:
   a signal generation circuit configured to generate a first output signal and a second output signal in response to a reference signal, the first output signal and the second output signal being a pair of complementary signals, the first output signal having first transitions of a first polarity and second transitions of a second polarity and the second output signal having third transitions of the second polarity that are simultaneous to the first transitions and having fourth transitions of the first polarity non-simultaneously corresponding to the second transitions.

2. The integrated circuit of claim 1, further wherein:
   the signal generation circuit is configured to generate the first output signal and the second output signal based on the reference signal and a complementary reference signal that is generated with regard to the reference signal.

3. The integrated circuit of claim 1, wherein the signal generation circuit is configured to generate the second output signal in which the fourth transitions are delayed from the second transitions.

4. The integrated circuit of claim 1, wherein the signal generation circuit is configured to generate the first output signal in which the second transitions are delayed from the fourth transitions.

5. The integrated circuit of claim 2, wherein the signal generation circuit further comprises:
   a first N-type transistor having a gate terminal configured to receive the reference signal and a source terminal coupled to a first supply potential; and
   a first P-type transistor having a gate terminal configured to receive the reference signal and a source terminal coupled to a second supply potential.

6. The integrated circuit of claim 5, wherein the signal generation circuit further comprises:
   a second N-type transistor having a gate terminal configured to receive the complementary reference signal and a source terminal coupled to the first supply potential; and
   a second P-type transistor having a gate terminal configured to receive the complementary reference signal and a source terminal coupled to the second supply potential.

7. The integrated circuit of claim 6, wherein the signal generation circuit further comprises:
   a third N-type transistor having a source terminal coupled to a drain terminal of the first N-type transistor, a gate terminal coupled to a drain terminal of the second P-type transistor, and a drain terminal coupled to a drain terminal of the first P-type transistor to output the first output signal; and
   a third P-type transistor having a gate terminal coupled to the drain terminal of the first N-type transistor and the source terminal of the third N-type transistor, a source terminal coupled to the drain terminal of the second P-type transistor and the gate terminal of the third N-type transistor, and a drain terminal coupled to a drain terminal of the second N-type transistor to output the second output signal.

8. The integrated circuit of claim 6, wherein the signal generation circuit further comprises:
a third N-type transistor having a gate terminal coupled to the drain terminal of the first P-type transistor, a source terminal coupled to the drain terminal of the second N-type transistor and a drain terminal coupled to the drain terminal of the second P-type transistor to output the second output signal; and
a third P-type transistor having a gate terminal coupled to the drain terminal of the second N-type transistor and to the source terminal of the third N-type transistor, a source terminal coupled to the gate terminal of the third N-type transistor and to the drain terminal of the first P-type transistor, and a drain terminal coupled to the drain terminal of the first N-type transistor and to output the first output signal.

9. A method consisting of:
receiving a reference signal;
generating a first output signal in response to the reference signal, the first output signal having first transitions of a first polarity and second transitions of a second polarity; and
generating a second output signal in response to the reference signal, the first output signal and the second output signal being a pair of complementary signals, the second output signal having third transitions of the second polarity that are simultaneous to the first transitions and having fourth transitions of the first polarity non-simultaneously corresponding to the second transitions.

10. The method of claim 9, further comprising:
inverting the reference signal to generate a complementary reference signal;
generating the first output signal as an inverse of the reference signal; and
generating the second output signal as an inverse of the complementary reference signal.

11. The method of claim 9, wherein generating the second signal further comprises:
generating the second output signal having the fourth transitions delayed to the second transitions.

12. A system, consisting of:
a complementary signal generation circuit configured to generate a first output signal and a second output signal in response to a reference signal, the first output signal and the second output signal being a pair of complementary signals, the first output signal having first transitions of a first polarity and second transitions of a second polarity and the second output signal having third transitions of the second polarity that are simultaneous to the first transitions and having fourth transitions of the first polarity non-simultaneously corresponding to the second transitions; and
a function circuit having a first portion configured to be operative in response to the first transitions of the first output signal, and a second portion configured to be operative in response to the third transitions of the second output signal.

13. The system of claim 12, wherein:
the signal generation circuit is configured to generate the first output signal and the second output signal based on the reference signal and a complementary reference signal that is generated with regard to the reference signal.

14. The system of claim 12, wherein the signal generation circuit is configured to generate the second output signal in which the fourth transitions are delayed from the second transitions.

15. The system of claim 12, wherein the signal generation circuit is configured to generate the first output signal in which the second transitions are delayed from the fourth transitions.

16. The system of claim 13, wherein the signal generation circuit further comprises:
a first N-type transistor having a gate terminal configured to receive the reference signal and a source terminal coupled to a first supply potential; and
a first P-type transistor having a gate terminal configured to receive the reference signal and a source terminal coupled to a second supply potential.

17. The system of claim 16, wherein the signal generation circuit further comprises:
a second N-type transistor having a gate terminal configured to receive the complementary reference signal and a source terminal coupled to the first supply potential; and
a second P-type transistor having a gate terminal configured to receive the complementary reference signal and a source terminal coupled to the second supply potential.

18. The system of claim 17, wherein the signal generation circuit further comprises:
a third N-type transistor having a source terminal coupled to a drain terminal of the first N-type transistor, a gate terminal coupled to a drain terminal of the second P-type transistor, and a drain terminal coupled to a drain terminal of the first P-type transistor to output the first output signal; and
a third P-type transistor having a gate terminal coupled to the drain terminal of the first N-type transistor and the source terminal of the third N-type transistor, a source terminal coupled to the drain terminal of the second P-type transistor and the gate terminal of the third N-type transistor, and a drain terminal coupled to a drain terminal of the second N-type transistor to output the second output signal.

19. The system of claim 17, wherein the signal generation circuit further comprises:
a third N-type transistor having a gate terminal coupled to the drain terminal of the first P-type transistor, a source terminal coupled to the drain terminal of the second N-type transistor and a drain terminal coupled to the drain terminal of the second P-type transistor to output the second output signal; and
a third P-type transistor having a gate terminal coupled to the drain terminal of the second N-type transistor and to the source terminal of the third N-type transistor, a source terminal coupled to the gate terminal of the third N-type transistor and to the drain terminal of the first P-type transistor, and a drain terminal coupled to the drain terminal of the first N-type transistor and to output the first output signal.

* * * * *